United States Patent
Yaffe et al.

(10) Patent No.: US 9,843,750 B2
(45) Date of Patent: Dec. 12, 2017

(54) METHODS OF CALIBRATING LINEAR-LOGARITHMIC IMAGE SENSORS

(71) Applicant: Samsung Electronics Co., Ltd., Suwon-si (KR)

(72) Inventors: Yoel Yaffe, Modiin (IL); Claudio G. Jakobson, Netanya (IL); Shemi Prazot, Bet Horon (IL); Uzi Hizi, Herzliya (IL)

(73) Assignee: Samsung Electronics Co., Ltd. (KR)

( * ) Notice: Subject to any disclaimer, the term of this patent is extended or adjusted under 35 U.S.C. 154(b) by 24 days.

(21) Appl. No.: 14/224,198

(22) Filed: Mar. 25, 2014

(65) Prior Publication Data
US 2015/0281683 A1     Oct. 1, 2015

(51) Int. Cl.
| H04N 5/232 | (2006.01) |
| H04N 5/365 | (2011.01) |
| H04N 5/374 | (2011.01) |
| H04N 17/00 | (2006.01) |
| H04N 5/355 | (2011.01) |
| H01L 27/146 | (2006.01) |

(52) U.S. Cl.
CPC ....... *H04N 5/3651* (2013.01); *H04N 5/35518* (2013.01); *H04N 5/374* (2013.01); *H04N 17/002* (2013.01); *H01L 27/14643* (2013.01)

(58) Field of Classification Search
CPC ...... H04N 5/378; H04N 5/374; H04N 5/3538; H04N 5/3651; H04N 5/35518; H04N 17/002; H01L 27/14643
USPC .......................................... 348/297
See application file for complete search history.

(56) References Cited

U.S. PATENT DOCUMENTS

| 5,086,343 A | 2/1992 | Cook et al. |
| 6,069,377 A | 5/2000 | Prentice et al. |

(Continued)

FOREIGN PATENT DOCUMENTS

| JP | 2006303768 | 11/2006 |
| JP | 2008099158 | 4/2008 |

(Continued)

OTHER PUBLICATIONS

Jiwon Lee et al. "New FPN Correction Method for PD-Storage Dual-capture CMOS Image Sensor using a Nonfully Depleted Pinned Photodiode" Proc. IEEE Int. Symp. Circuits Syst., pp. 1620-1623 (2012).*

(Continued)

*Primary Examiner* — Antoinette Spinks
(74) *Attorney, Agent, or Firm* — Myers Bigel, P.A.

(57) ABSTRACT

Methods of calibrating a linear-logarithmic image sensor pixel include performing a reset of the pixel in advance of establishing a leakage current between a photodiode and a floating diffusion region of the pixel. A first voltage of the floating diffusion region is then read through a source follower and selection transistor, after the leakage is terminated. A step is then performed to transfer charge between the photodiode and the floating diffusion region of the pixel so that a voltage of a cathode of the photodiode is increased. Thereafter, a second voltage of the floating diffusion region is read. The first and second read voltages are then used to perform a calibration operation. These steps may be repeated to establish another leakage current of different duration/magnitude and yield third and fourth read voltages, which support further calibration.

13 Claims, 12 Drawing Sheets

(56) References Cited

U.S. PATENT DOCUMENTS

| | | | |
|---|---|---|---|
| 6,642,503 B2 | 11/2003 | Kummaraguntla et al. | |
| 7,224,848 B2 | 5/2007 | Hofflinger et al. | |
| 7,663,683 B2 | 2/2010 | Miyatake | |
| 7,755,690 B2 | 7/2010 | Suzuki et al. | |
| 7,800,673 B2 | 9/2010 | Sugawa et al. | |
| 7,804,537 B2 | 9/2010 | Storm et al. | |
| 7,920,193 B2 | 4/2011 | Ladd et al. | |
| 7,924,332 B2 | 4/2011 | Gruev et al. | |
| 7,995,125 B2 | 8/2011 | Blessinger | |
| 8,130,298 B2 | 3/2012 | Corson et al. | |
| 8,130,302 B2 | 3/2012 | Johnson | |
| 8,146,820 B2 | 4/2012 | Wang et al. | |
| 8,150,201 B2 * | 4/2012 | Kasai | H04N 5/2351 382/274 |
| 8,233,059 B2 | 7/2012 | Kamon et al. | |
| 8,368,002 B2 | 2/2013 | Hosier et al. | |
| 8,593,550 B2 | 11/2013 | Lee et al. | |
| 8,615,132 B2 | 12/2013 | Nikula et al. | |
| 2008/0259178 A1 | 10/2008 | Oike | |
| 2008/0303928 A1 | 12/2008 | Kusuda | |
| 2009/0046180 A1 | 2/2009 | Shibano et al. | |
| 2010/0025569 A1 * | 2/2010 | Matsumoto | H01L 27/14609 250/208.1 |
| 2010/0045650 A1 | 2/2010 | Fish et al. | |
| 2010/0289932 A1 | 11/2010 | Hashimoto | |
| 2011/0032403 A1 | 2/2011 | Mabuchi | |
| 2011/0316839 A1 | 12/2011 | Minowa et al. | |
| 2012/0002090 A1 | 1/2012 | Aoki et al. | |
| 2012/0211642 A1 * | 8/2012 | Iwamoto | H04N 5/35509 250/208.1 |

FOREIGN PATENT DOCUMENTS

| | | |
|---|---|---|
| JP | 2012119775 | 6/2012 |
| JP | 2012124835 | 6/2012 |

OTHER PUBLICATIONS

Joseph et al., "Modeling and Calibration of logarithmic CMOS image sensors", Sep. 30, 2002; University of Oxford, 188 pages.

Joseph, Dileepan, "Logarithmic CMOS image sensors", 2003, University of Oxford, http://www.ece.ualberta.ca/~djoseph/presentations/Research_2003.ppt, 24 pages.

Liu, Yang, "The Design of a High Dynamic Range CMOS Image Sensor in 110nm Technology", Aug. 2012, Delft University of Technology, 93 pages.

York, Timothy, "Fundamentals of Image Sensor Performance", May 5, 2011, http://www.cse.wustl.edu/~jain/cse567-11/ftp/imgsens/index.html, 8 pages.

* cited by examiner

METHODS OF CALIBRATING LINEAR-LOGARITHMIC IMAGE SENSORS

CROSS-REFERENCE TO RELATED APPLICATION

This application is related to U.S. application Ser. No. 14/224,264, filed Mar. 25, 2014, entitled "Methods of Calibrating Knee-Point and Logarithmic Slope in Linear-Logarithmic Image Sensors," the disclosure of which is hereby incorporated herein by reference.

FIELD OF THE INVENTION

The present invention relates to integrated circuit devices and, more particularly, to image sensor devices and methods of operating same.

BACKGROUND OF THE INVENTION

Conventional CMOS image sensors can have a linear response to relatively low illumination and a logarithmic response to relatively high illumination, with a transition between the linear and logarithmic responses being referred to as a knee point (KNPT). As will be understood by those skilled in the art, an image sensor may be fully characterized when its linear sensitivity, logarithmic sensitivity (LOGS) and KNPT voltage are known. Because these parameters vary with process, transistor mismatch and temperature, etc., calibration is required. Without accurate calibration, a linear-logarithmic image sensor may introduce very large fixed pattern noise (FPN), which is typically not suitable for commercially viable applications. One conventional technique to inhibit FPN uses an external frame memory to store a sensor characteristic response. Based on this technique, a correction of the sensor readout for each pixel is performed after a full frame of image data is captured by an image signal processing (ISP) circuit and then modified by the sensor data stored in the external frame memory, which may have a relatively large capacity. Moreover, relatively complex ISP algorithms may be required to perform image sensor correction, which can be computationally expensive and time consuming.

A conventional linear-logarithmic image sensing apparatus is disclosed in U.S. Pat. No. 8,233,059 to Kamon et al., entitled "Image Sensing Apparatus." In this apparatus, an image sensor is disclosed that generates an electrical signal commensurate with an amount of incident light. The sensor has a photoelectric conversion characteristic defined by a linear characteristic area where an electrical signal is outputted after being linearly converted in relation to the amount of incident light, and a logarithmic characteristic area where the electrical signal is outputted after being logarithmically converted in relation to the amount of incident light. An exposure evaluation value detector (EEVD) is also included, which detects an exposure evaluation value based on luminance information acquired from a subject in sensing an image of the subject. An exposure controller is further provided, which acquires a setting value for exposure based on the exposure evaluation value detected by the EEVD to thereby control exposure of the image sensing apparatus.

SUMMARY OF THE INVENTION

Methods of calibrating a linear-logarithmic image sensor pixel according to embodiments of the invention may utilize on-the-fly calibration operations, which can avoid the need for a large frame "calibration" memory and extensive image signal processing (ISP) algorithms. These calibration operations can measure a voltage at a pixel floating diffusion (FD) region after at least one sub-threshold current is enabled to flow from a photodiode (PD) to the FD region via a transfer transistor, which is responsive to a transfer gate (TG) voltage. Because the direction of the sub-threshold current(s) is inverse to the one used during pixel integration, the resulting calibration process can be photocurrent-independent.

According to some of the embodiments of the invention, the methods of calibrating include at least partially depleting a photodiode within the pixel prior to supplying a floating diffusion (FD) region within the pixel with a first subthreshold current. This first subthreshold current is achieved by passing charge carriers of first conductivity type from the at least partially depleted photodiode to the floating diffusion (FD) region. A first voltage of the floating diffusion region may then be read through a totem pole arrangement of a source follower transistor and a selection transistor within the pixel (e.g., within a four transistor (4T) cell). A calibration operation may then performed to use the first voltage to determine a knee-point (KNPT) voltage associated with a transition from a linear to logarithmic response of the pixel. The step of at least partially depleting the photodiode may include establishing a reverse bias across anode and cathode regions of the photodiode by shorting the floating diffusion region to the cathode region concurrently with supplying the floating diffusion region with a pull-up current. This supplying the floating diffusion region with a pull-up current may include turning on a reset transistor within the pixel. This reset transistor may have a first current carrying terminal electrically connected to the floating diffusion region and a second current carrying terminal responsive to a positive reset voltage (VR), which may be controlled to have an adjustable magnitude. In some embodiments of the invention, the reset transistor may be an NMOS transistor having a source terminal electrically connected to the floating diffusion region and a drain terminal responsive to the positive reset voltage.

According to still further embodiments of the invention, the step of supplying the floating diffusion (FD) region within the pixel with a first subthreshold current is preceded by discharging the floating diffusion region, after the step of at least partially depleting the photodiode. The step of discharging the floating diffusion region may include discharging the floating diffusion region through the reset transistor within the pixel. In this manner, the reset transistor may be used to provide a pull-up current to deplete the photodiode and thereafter sink a pull-down current from the floating diffusion region.

According to additional embodiments of the invention, the reading step is followed by supplying the floating diffusion region with a second subthreshold current by passing charge carriers of first conductivity type from the at least partially depleted photodiode to the floating diffusion region. Thereafter, an operation is performed to read a second voltage of the floating diffusion region and estimate a logarithmic sensitivity of the pixel based at least in part on the value of the second voltage. In these embodiments, the duration of supplying the floating diffusion region with a second subthreshold current may be greater than a duration of supplying the floating diffusion region with the first subthreshold current, so that a quantity of charge transferred during supplying the floating diffusion region with a second subthreshold current is greater than a quantity of charge transferred during supplying the floating diffusion region with the first subthreshold current.

Still further embodiments of the invention include methods of performing two point calibration of a linear-logarithmic image sensor pixel by, among other things, measuring voltages of a floating diffusion region of the pixel after establishing a plurality of unequal sub-threshold currents through a transfer transistor of the pixel. These methods include at least partially depleting a photodiode within the pixel by driving a cathode of the photodiode with a pull-up current. Thereafter, a floating diffusion region of the pixel is supplied with a first subthreshold current by passing charge carriers of first conductivity type from the at least partially depleted photodiode to the floating diffusion region. A first voltage of the floating diffusion region is then read and used for calibration. The floating diffusion region is further supplied with a second subthreshold current by passing charge carriers of first conductivity type from the at least partially depleted photodiode to the floating diffusion region. A second voltage of the floating diffusion region is then read and used for calibration.

According to some of these two-point calibration methods, the step of driving the cathode of the photodiode with the pull-up current includes shorting the cathode of the photodiode to the floating diffusion region. Moreover, in the event the pixel includes a totem-pole arrangement of a reset transistor and a transfer transistor, a source terminal of the reset transistor may be electrically connected to the floating diffusion region and to a drain terminal of the transfer transistor and the driving the cathode of the photodiode with the pull-up current may include turning on the reset and transfer transistors. In this manner, the step of driving the cathode of the photodiode with the pull-up current may include pulling-up the cathode of the photodiode to a relatively high voltage, which may be equivalent to a voltage of a drain terminal of the reset transistor (assuming the voltages of the gate terminals of the transfer and reset transistors are sufficiently high). In addition, the step of supplying a floating diffusion region within the pixel with a first subthreshold current can be preceded by a step of discharging the floating diffusion region by driving the drain terminal of the reset transistor high-to-low while a gate terminal of the reset transistor is maintained at a high voltage level.

Methods of calibrating linear-logarithmic image sensors according to still further embodiments of the invention include performing a reset of an image sensor pixel (e.g., to a low voltage) in advance of establishing a subthreshold leakage current between a photodiode and a floating diffusion region of the pixel. A first voltage of the floating diffusion region is then read after terminating the leakage current. Charge is then transferred between the photodiode and the floating diffusion region of the pixel by driving up a gate voltage of the transfer transistor so that a voltage of a cathode of the photodiode is increased. A second voltage of the floating diffusion region is then read after terminating the transfer of charge. These first and second unequal voltages are then used to perform calibration. The step of performing the reset includes turning on a totem pole arrangement of a reset transistor and a transfer transistor so that the cathode of the photodiode can be pulled-down to a voltage of the floating diffusion region. In particular, in the event a source terminal of the transfer transistor is electrically connected to the cathode of the photodiode and a source terminal of the reset transistor is electrically connected to the floating diffusion region, then the step of performing a reset includes turning on the reset and transfer transistors so that the cathode of the photodiode can be pulled-down to a voltage of a drain terminal of reset transistor.

In addition, the step of establishing a leakage current can be performed while the transfer transistor is operating in subthreshold and the reset transistor is sourcing current to the floating diffusion region, whereas the step of reading the first voltage is performed while the reset and transfer transistors are turned off. Moreover, the step of reading the first voltage can be followed by turning on the transfer transistor during the step of transferring charge between the photodiode and the floating diffusion region and then turning off the transfer transistor during the step of reading the second voltage.

Additional embodiments of the invention include calibrating a linear-logarithmic image sensor pixel by, among other things, performing a reset of the pixel by equilibrating a voltage of a cathode of a photodiode therein with a voltage of a floating diffusion region. This step is performed in advance of resetting the floating diffusion region by pulling-up a voltage of the floating diffusion region after isolating the floating diffusion region from the cathode of the photodiode. A first voltage of the floating diffusion region is then read in advance of establishing a first subthreshold leakage current between the floating diffusion region and the cathode of the photodiode for a first duration. Thereafter, a second voltage of the floating diffusion region is read after isolating the floating diffusion region from the cathode of the photodiode.

These calibration operations further include performing another reset of the pixel by equilibrating a voltage of the cathode of the photodiode therein with a voltage of the floating diffusion region, and then resetting the floating diffusion region by pulling-up a voltage of the floating diffusion region after isolating the floating diffusion region from the cathode of the photodiode. A third voltage of the floating diffusion region is then read in advance of establishing a second subthreshold leakage current between the floating diffusion region and the cathode of the photodiode for a second duration. A fourth voltage of the floating diffusion region is then read after isolating the floating diffusion region from the cathode of the photodiode.

According to preferred aspects of these embodiments of the invention, the second duration is greater than the first duration and/or the second subthreshold leakage current is greater than the first subthreshold leakage current. Alternatively, the vice versa conditions may apply, which means the second duration can be shorter than the first duration and/or the second subthreshold leakage current can be less than the first subthreshold leakage current. Moreover, the steps of establishing first and second subthreshold leakage currents can be performed while a reset transistor of the pixel is turned off. This reset transistor within a 4T pixel includes a source terminal electrically connected to the floating diffusion region. In particular, the step of performing a reset may include turning on a totem pole arrangement of a reset transistor and a transfer transistor so that a pull-down force can be applied simultaneously to the cathode of the photodiode and the floating diffusion region.

DETAILED DESCRIPTION OF EMBODIMENTS

Figure 1A:
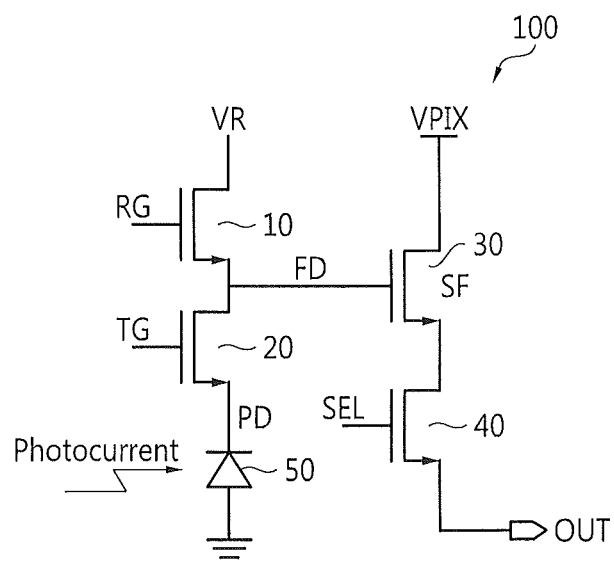
FIG. 1A is an electrical schematic of a four transistor (4T) linear-logarithmic image sensor pixel that supports on-the-fly calibration according to embodiments of the invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A is an electrical schematic of a four transistor (4T) linear-logarithmic image sensor pixel 100 that has a linear response to relatively low illumination and a logarithmic response to relatively high illumination. This pixel 100 advantageously supports large pixel densities and typically uses the same architecture associated with 4T linear pixels, which are widely used in CMOS image sensor (CIS) design. As will be understood by those skilled in the art, because the knee-point (KNPT) and logarithmic sensitivity (LOGS) of the pixel 100 typically vary with fabrication process, transistor mismatch and temperature etc., image sensors based on such pixels may require calibration in order to avoid excessive fixed pattern noise (FPN). As described herein, the pixel 100 may be calibrated on-the-fly without requiring a frame memory, using an algorithm that is independent of photocurrent. Depending on the process characteristics, one or two calibration measurements may be required. These measurements, which may require only a few microseconds, can be done adjacent in time to the pixel readout. If required by the sensor timing, a line buffer may be used to store the pixel or calibration data between the pixel readout and calibration readout.

As shown by FIG. 1A, the 4T pixel 100 includes a first totem pole arrangement of an NMOS reset transistor 10 and an NMOS transfer transistor 20 and a second totem pole arrangement of an NMOS source follower (SF) 30 and an NMOS select transistor 40, interconnected as illustrated. The reset transistor 10 has a drain terminal responsive to a variable reset voltage (VR), a source terminal electrically connected to a floating diffusion (FD) region and gate terminal of the source follower 30, and a gate terminal responsive to a reset gate signal (RG). The transfer transistor 20 has a drain terminal electrically connected to the floating diffusion region FD, a source terminal electrically connected to a cathode of a photodiode 50 and a gate terminal responsive to a transfer gate signal (TG). The source follower 30 has a drain terminal responsive to a positive supply voltage (VPIX), which may be a fixed voltage, and a source terminal electrically connected to a drain terminal of the select transistor 40. The select transistor 40 has a gate terminal responsive to a pixel select signal (SEL) and a source terminal connected to a pixel output terminal (OUT).

Linear-logarithmic operation of the pixel 100 can be enabled by setting the TG voltage to a medium voltage. At low illumination, no current flows through the transfer transistor 20 during photocurrent integration and the response of the pixel is linear. However, when the illumination increases, a subthreshold current flows through the transfer transistor 20 in a direction opposite to the photocurrent and causes a logarithmic response of the pixel 100. Because of the large variation of the subthreshold current, the logarithmic response becomes highly variable in response to process variation, device (e.g., transistor) mismatch and temperature. The variable reset voltage (VR) shown in FIG. 1A is typically held at a positive supply voltage equivalent to VPIX, but can be varied to enable reset of internal pixel voltages (e.g., FD voltage) that are used in the calibration process described more fully hereinbelow.

As will be understood by those skilled in the art, the pixel signal can be read as in a linear pixel in two steps following a Correlated Double Sampling (CDS) procedure. The first measure of the CDS is the FD reset voltage and the second measure of the CDS is the FD voltage after transferring the accumulated photodiode (PD) charge. The CDS pixel signal is the difference between the second and first measurements. Moreover, as will now be described, following the two-step pixel read operations, which enable the determination of the CDS pixel signal, on-the-fly calibration measurements may be performed that are independent of photocurrent and adjacent-in-time to the pixel signal determination. In particular, as shown by the well-potential sequence of FIG. 1B, which corresponds to the first totem pole arrangement of the reset transistor 10, transfer transistor 20 and photodiode 50, two-point calibration of the pixel 100 may be performed using steps (a) through (h), whereas one-point calibration may be performed using steps (a) through (f) (and omitting steps (g) and (h)).

Figure 1B:
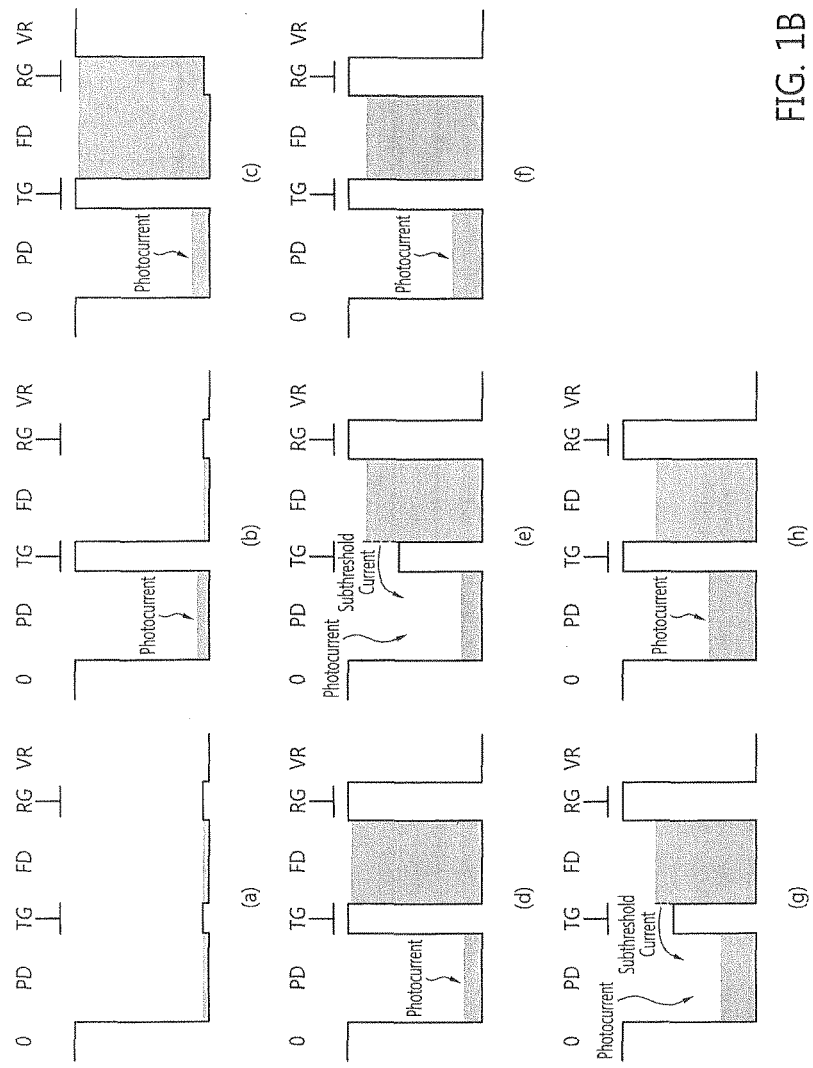
FIG. 1B illustrates a well-potential sequence associated with the transfer and reset transistors associated with a left side of the 4T linear-logarithmic image sensor pixel of FIG. 1A, according to embodiments of the invention.
Figure 1C:
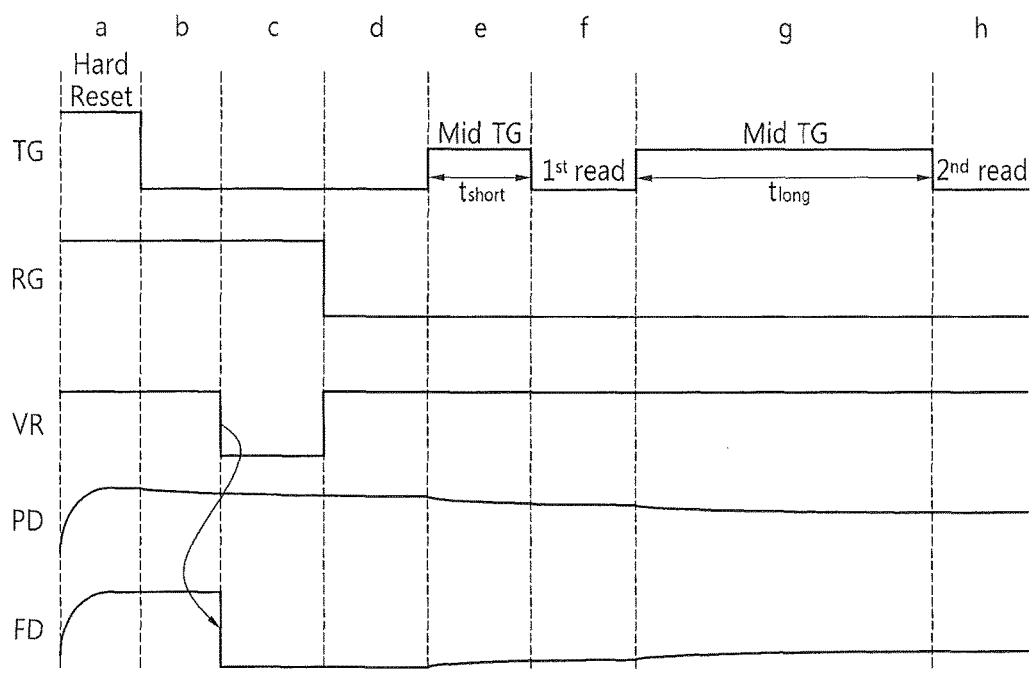
FIG. 1C is a timing diagram that illustrates the timing of voltages associated with the well-potential sequence of FIG. 1B, according to embodiments of the invention.

As shown by initial step (a) in FIGS. 1B-1C, a hard reset of the pixel 100 is performed by fully depleting the photodiode 50 by establishing a large reverse bias across the cathode and anode of the photodiode 50. This reverse bias can be achieved by pulling up the voltage on the cathode of the photodiode 50 by turning on the reset transistor 10 and the transfer transistor 20 and holding the variable reset voltage (VR) at a positive voltage level (e.g., VPIX). This combination of conditions can yield: (i) a cathode voltage equal to $VR-Vth_{10}-Vth_{20}$, where $Vth_{10}$ and $Vth_{20}$ are the threshold voltages of the NMOS reset transistor 10 and the NMOS transfer transistor 20, respectively; and (ii) a floating diffusion (FD) region voltage equal to $VR-Vth_{10}$.

Thereafter, as shown by step (b), the TG voltage is lowered to thereby isolate the photodiode while the photocurrent begins to integrate at the diode capacitance. Then, in step (c), the voltage of the floating diffusion (FD) region is reset to a low voltage level by driving the variable reset voltage (VR) high-to-low before the FD region is electrically isolated at step (d) by switching the reset gate voltage RG high-to-low. Next, as shown by step (e), the transfer gate voltage TG is increased to a medium voltage (mid TG) to thereby establish a first subthreshold current, which flows from the photodiode (PD) to the floating diffusion (FD) region for a relatively short duration (e.g., $t_{short}$). Then, as shown by step (f), the transfer gate voltage TG is lowered to thereby isolate the FD region and enable read-out of a first FD calibration voltage via the second totem pole arrangement of the NMOS source follower (SF) 30 and the NMOS select transistor 40. Next, as shown by steps (g)-(h), to support two-point calibration, the transfer gate voltage TG is again increased to the medium voltage (mid TG) for a somewhat longer duration (e.g., $t_{long}$) before it is lowered to isolate the FD region and enable read-out of a second FD calibration voltage.

As will be understood by those skilled in the art, the calibration operations highlighted by FIGS. 1B-1C advantageously do not depend upon the photocurrent, as highlighted by the current directions shown in steps (e) and (g). In contrast, during conventional photocurrent integration, the photocurrent and TG subthreshold current flow in opposite directions and compensate each other. However, to make the calibration process photocurrent independent, the subthreshold current direction (during calibration) is inversed, which means the photocurrent and subthreshold current flow in the same direction to thereby partially discharge the reversed-biased capacitance of the photodiode (PD). During calibration, the reverse voltage across the PD varies, but the FD voltage is not affected and the value of the FD voltage depends only on the TG voltage.

As determined by the inventors herein, to achieve one-point calibration, the FD voltage can be read after a fixed time duration and its value can be used for KNPT determination and LOGS correction. Moreover, for two-point calibration, two sub-threshold currents of different duration (or achieved in response to unequal TG voltages) may be established by setting the correct lengths of $t_{short}$ and $t_{long}$ at steps (e) and (g). The duration of $t_{short}$ should be long enough to obtain a proper value of the subthreshold current, but not too long to fully charge the FD region or fully discharge the PD. In addition, because the subthreshold current may decrease exponentially with time, the time required for $t_{long}$ should be significantly greater than $t_{short}$ but nonetheless short enough to avoid fully discharging the PD.

Precise subthreshold currents through the transfer transistor 20 may not be necessary, but adequate timing and voltages must be chosen in order to support operation of the transfer transistor 20 in subthreshold. In two-point calibration, the time windows can be adjusted to provide approximately one order of magnitude difference between the subthreshold currents generated during steps (e) and (g) or an approximately 100 mV voltage difference between the TG voltages during these steps (where the differences between $t_{long}$ and $t_{short}$ may no longer apply). During one-point calibration, the duration of the subthreshold current should be short enough to maintain operation in subthreshold but long enough to provide adequate sensitivity to subthreshold variations so that the calibration voltage can be used to provide correction of both KNPT and LOGS variation. In contrast, during two-point calibration, one of the calibration voltages is used to calibrate the KNPT while the difference between the first and second calibration voltages provides an estimate of the LOGS. The timing for the calibration sequence of FIG. 1B and the voltages of the PD and FD are shown by FIG. 1C. A CDS readout is still necessary to eliminate the variations in the pixel transistors, particularly since the offset variations in the source follower (SF) transistor 30 can be substantial. CDS may be introduced by measuring the FD reset voltage at step (d).

Figure 2:
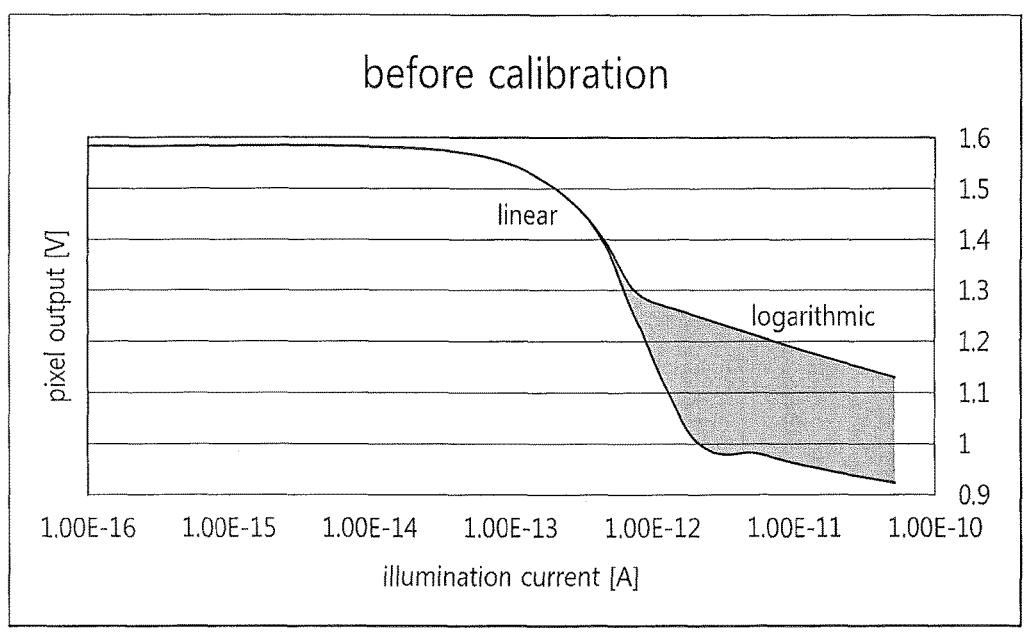
FIG. 2 is a graph illustrating a simulated linear-logarithmic response of the 4T pixel of FIG. 1A before calibration.
Figure 3:
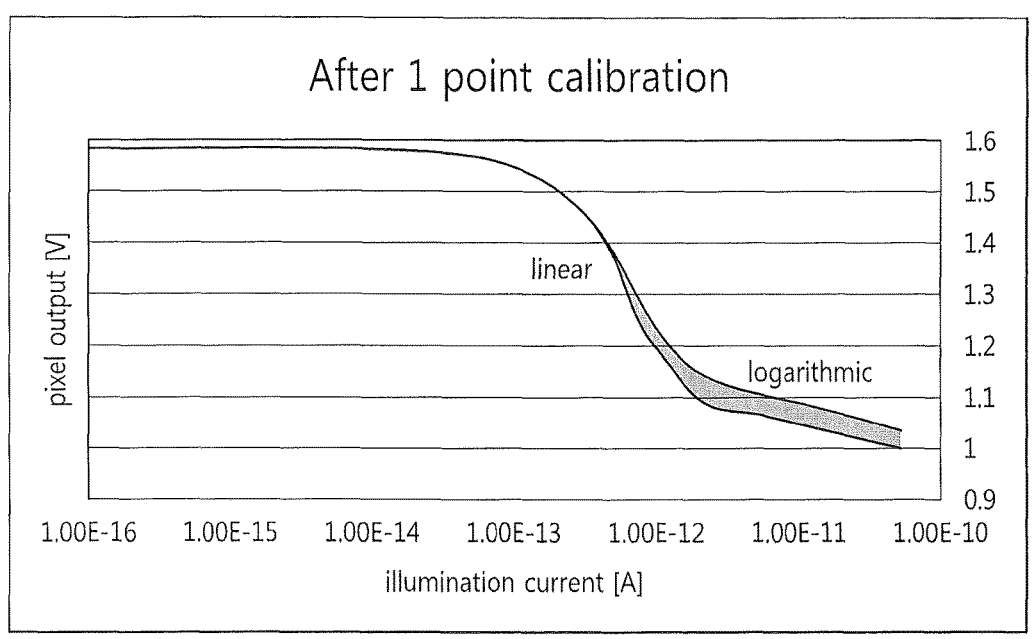
FIG. 3 is a graph illustrating a simulated linear-logarithmic response of the 4T pixel of FIG. 1A after one-point calibration.
Figure 4:
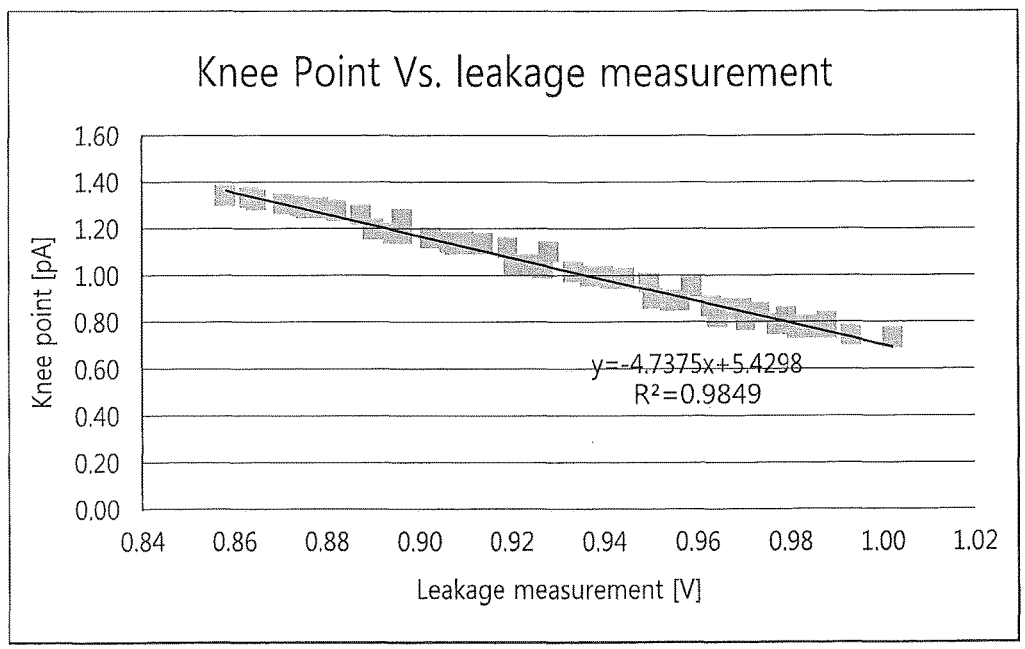
FIG. 4 is a graph illustrating a simulated correlation between the knee-point (KNPT) voltage and the one-point calibration voltage, according to embodiments of the invention.
Figure 5:
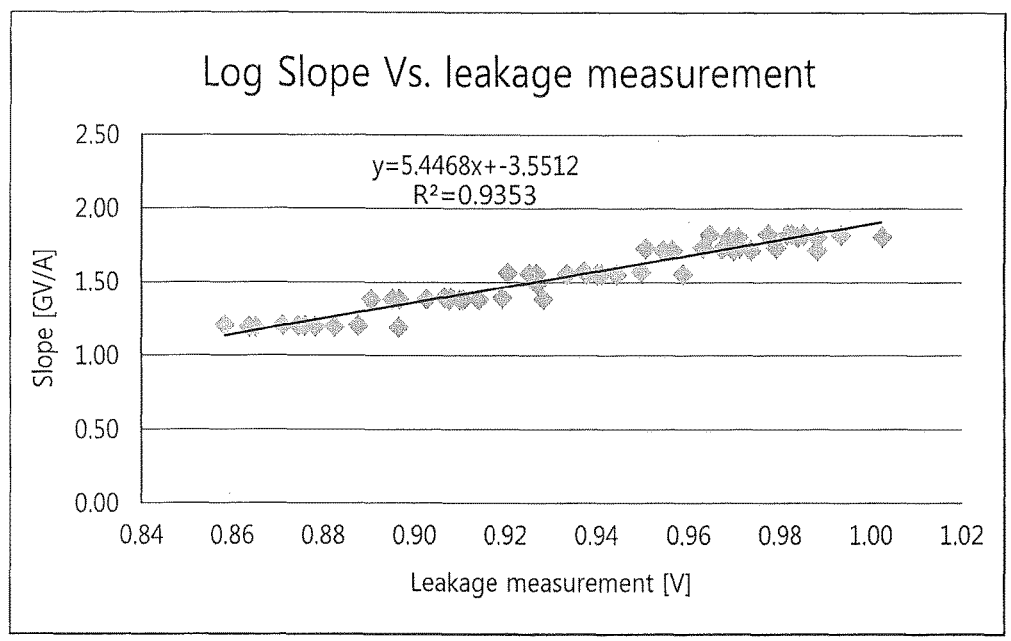
FIG. 5 is a graph illustrating a simulated correlation between logarithmic sensitivity (LOGS) and the one-point calibration voltage, according to embodiments of the invention.

Embodiments of the calibration methods described hereinabove have been simulated using MOSFET transistors from a 65 nm fabrication process. Temperature, transistor and device mismatch and process variations are included in the simulation by proper setting of device corners and running Monte-Carlo simulations. The reset transistor 10 and transfer transistor 20 are included in the simulation and proper values of the PD and FD capacitances were adjusted by adding ideal capacitors, which adjust the pixel response to the one measured from fabricated pixels. The simulated linear-logarithmic pixel response before calibration for different temperatures and process variations is highlighted by the graph of FIG. 2. In this graph, the linear response is essentially the same for all pixels, but quite variable in the logarithmic region of operation. The simulated effect of one-point calibration is shown by FIG. 3, where the following conditions apply: (i) a target pixel response to illumination is determined by simulation at typical conditions; (ii) a linear fix function from each pixel response to the target pixel response is calculated; (iii) a single correlation function is calculated based on average or best fit to all functions calculated in (ii); and a linear-logarithmic weight function is calculated as a function of illumination. The process described herein is tailored to simulation requirements. However, when the calibration is based on measurements, the pixel response required for the first step is determined by the average pixel response across a silicon chip. As shown by FIG. 4, a simulated correlation coefficient ($R^2$) between KNPT voltage and the one-point calibration voltage is 0.9849, which is close to unity. Likewise, as shown by FIG. 5, a simulated correlation coefficient ($R^2$) between the LOGS and the one-point calibration voltage is 0.935, which is sufficiently close to unity to support calibration.

Accordingly, as hereinabove described with respect to FIGS. 1A-1C and 2-5 and illustrated more fully by the flow diagram of FIG. 1D, methods of calibrating linear-logarithmic image sensors 110 according to embodiments of the invention including performing an operation to deplete a photodiode (PD) of a pixel by establishing a strong reverse bias across the photodiode, Block 110A. This reverse bias may be achieved by driving a floating diffusion (FD) region of the pixel to a relatively high voltage while a transfer transistor between the FD region and the PD is turned on. Thereafter, the FD region is discharged, Block 110B, in advance of supplying the FD region with a $1^{st}$ subthreshold current via the transfer transistor, Block 110C. This $1^{st}$ subthreshold current is insufficient to discharge a capacitance of the at least partially depleted PD. As shown by Block 110D, a first calibration point may be determined by reading a $1^{st}$ voltage of the FD region via, for example, an output stage of the pixel, which may include a source follower and select transistor in some embodiments of the invention. Next, the FD region is further supplied with a $2^{nd}$ subthreshold current and then the $2^{nd}$ voltage of the FD region is read, Blocks 110E-110F. The quantity of charge transferred from the PD to the FD region by the $2^{nd}$ subthreshold current may be greater than a quantity of charge transferred by the $1^{st}$ subthreshold current. Finally, as shown by Block 110G, two-point calibration may be performed as described above using the $1^{st}$ and $2^{nd}$ voltages read from the FD region of the pixel.

Figure 1D:
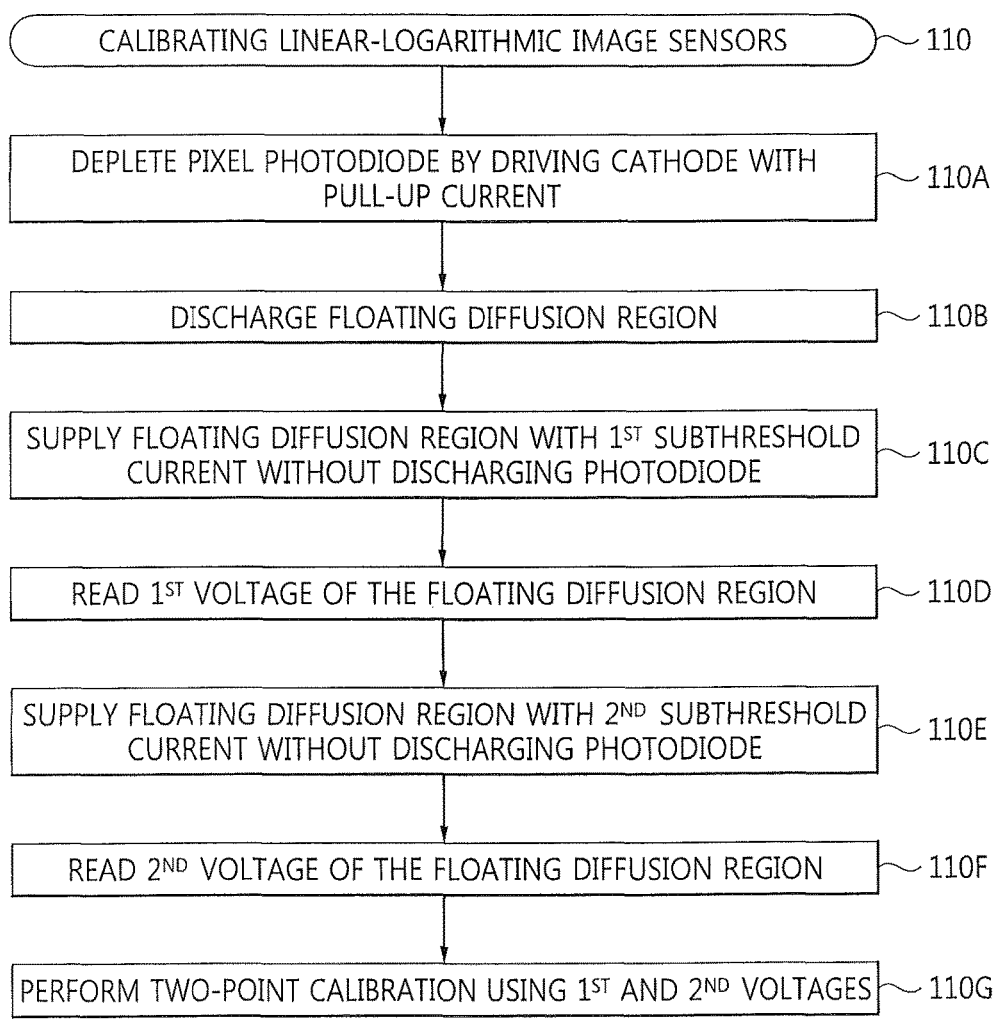
FIG. 1D is a flow diagram of operations associated with on-the-fly pixel calibration according to embodiments of the invention.
Figure 6A:
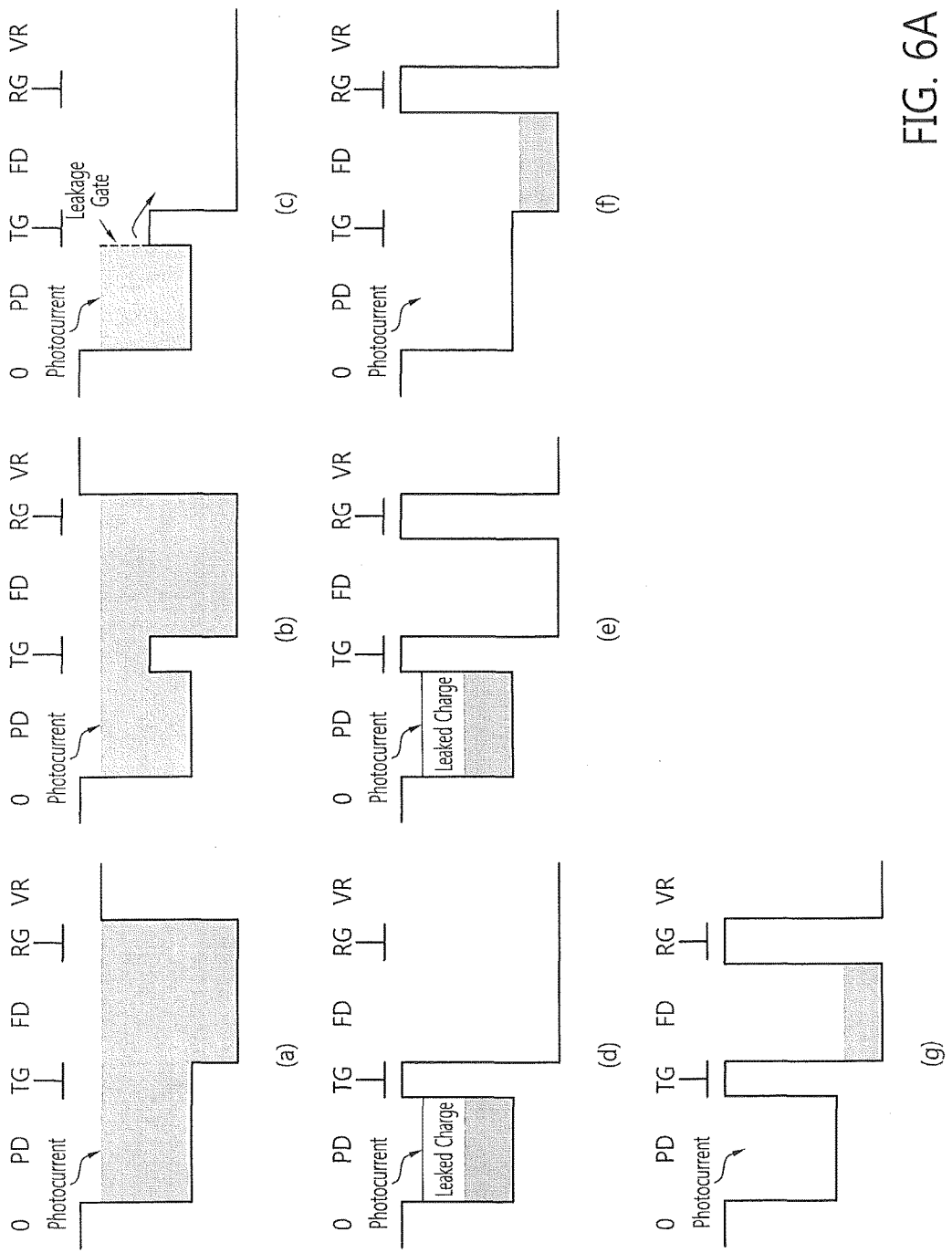
FIG. 6A illustrates a well-potential sequence associated with the transfer and reset transistors associated with a left side of the 4T linear-logarithmic image sensor pixel of FIG. 1A, which illustrates calibration operations according to additional embodiments of the invention.
Figure 6B:
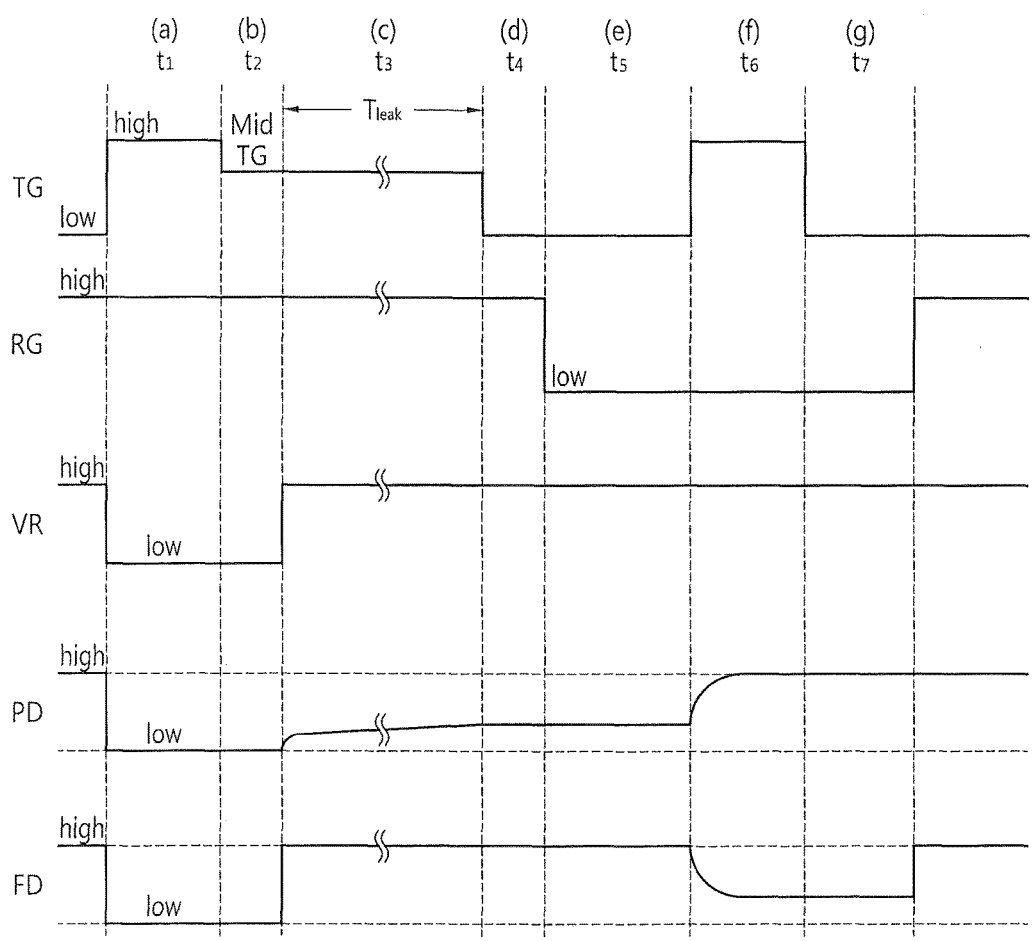
FIG. 6B is a timing diagram that illustrates the timing of voltages associated with the well-potential sequence of FIG. 6A, according to embodiments of the invention.

FIGS. 6A-6B illustrate linear-logarithmic calibration operations according to still further embodiments of the invention, which are related to the embodiments illustrated by FIGS. 1B-1D. In particular, FIG. 6A illustrates a well potential sequence associated with the left side of the 4T linear-logarithmic image sensor pixel 100 of FIG. 1A and FIG. 6B is a timing diagram that corresponds to the well-potential sequence of FIG. 6A. As shown by these figures, a method of calibrating a linear-logarithmic image sensor pixel 100 can include performing a reset of the pixel 100 (e.g., where the variable reset voltage VR=GND) in advance of establishing a leakage current between a photodiode (PD) and a floating diffusion (FD) region of the pixel 100. As shown by step (a) during time interval $t_1$, this reset operation may include turning on a transfer transistor 20 and a reset transistor 10 by driving the transfer gate (TG) and reset gate (RG) high to a logic 1 voltage level and driving a drain terminal of the reset transistor 10 to a logic 0 voltage level (e.g., variable reset voltage VR=GND), so that the voltages of a cathode of the photodiode PD and floating diffusion region FD are pulled low.

Thereafter, as shown by steps (b)-(c), during time intervals $t_2$, $t_3$, a mid-level "sub-threshold" gate voltage (mid-TG) is applied to the transfer gate TG in advance of driving the variable reset voltage VR low-to-high to thereby apply a strong pull-up force to the floating diffusion region (FD) and a weaker pull-up force to the cathode of the photodiode 50 (via the transfer transistor 20). In particular, as shown by FIG. 6B, during the time interval $t_3$, a voltage of the cathode of the photodiode 50 is gradually precharged in response to the abrupt low-to-high transition of the voltage of the floating diffusion region (FD). Thus, the steps (b)-(c) operate to establish a leakage current between the photodiode (PD) and the floating diffusion (FD) region of the pixel 100 while a voltage of the floating diffusion (FD) region is pulled low-to-high (e.g., to a voltage equal to the lesser of VR and $V_{RG}-Vth_{10}$).

Then, in step (d), during time interval $t_4$, the leakage current is terminated by turning off the transfer transistor 20. In step (e), during time interval $t_5$, the reset transistor 10 is turned off by driving RG high-to-low, which enables a "first" voltage of the floating diffusion (FD) region to be isolated and then read via the source follower (SF) transistor 30 and the select transistor 40. Thereafter, in steps (f)-(g), during time intervals $t_6$-$t_7$, relatively substantial charge is transferred between the photodiode (PD) 50 and the floating diffusion (FD) region. This charge transfer during time interval $t_6$, which occurs in response to turning on the transfer transistor 20 (e.g., by driving TG low-to-high) causes a voltage of the cathode of the photodiode 50 to be increased as a voltage of the FD region is decreased. Then, at the commencement of time interval $t_7$, the transfer gate voltage TG is switched low to turn-off the transfer transistor 20 and isolate the floating diffusion FD region so that a "second" voltage of the FD region may be read (step (g)). These first and second read voltages can then be used to support on-the-fly calibration operations as described more fully hereinabove.

Moreover, to achieve complete linear and logarithmic calibration of the pixel (KNPT, LOGS), the steps (a)-(g) illustrated by FIGS. 6A-6B are repeated in order to generate third and fourth read voltages. However, during these repeat operations, the duration $T_{leak}$ shown by FIG. 6B, which corresponds to the duration of step (c), is increased to support transfer of a higher quantity of charge between the photodiode (PD) and the floating diffusion region (FD).

Figure 7A:
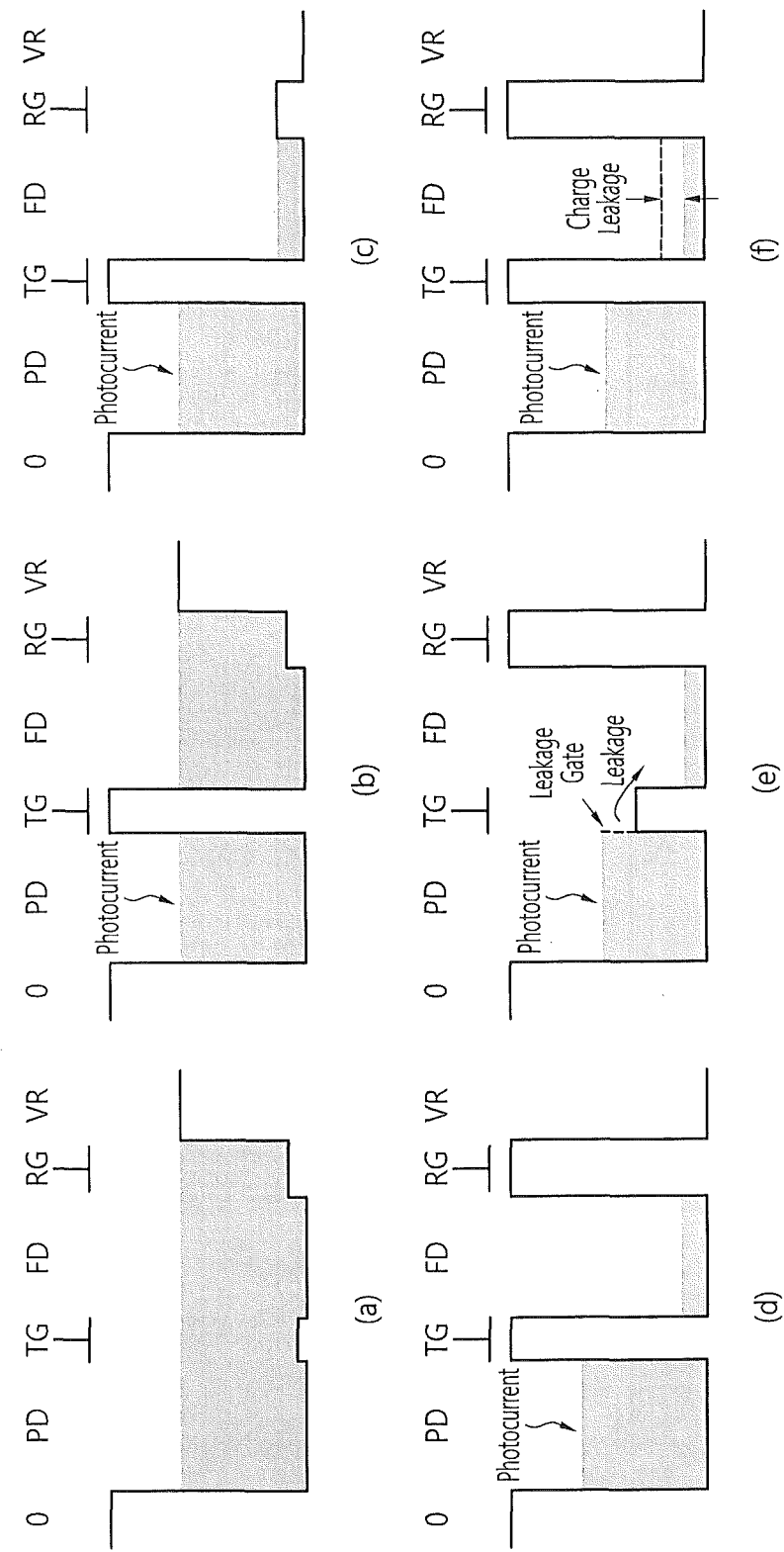
FIG. 7A illustrates a well-potential sequence associated with the transfer and reset transistors associated with a left side of the 4T linear-logarithmic image sensor pixel of FIG. 1A, which illustrates calibration operations according to additional embodiments of the invention.
Figure 7B:
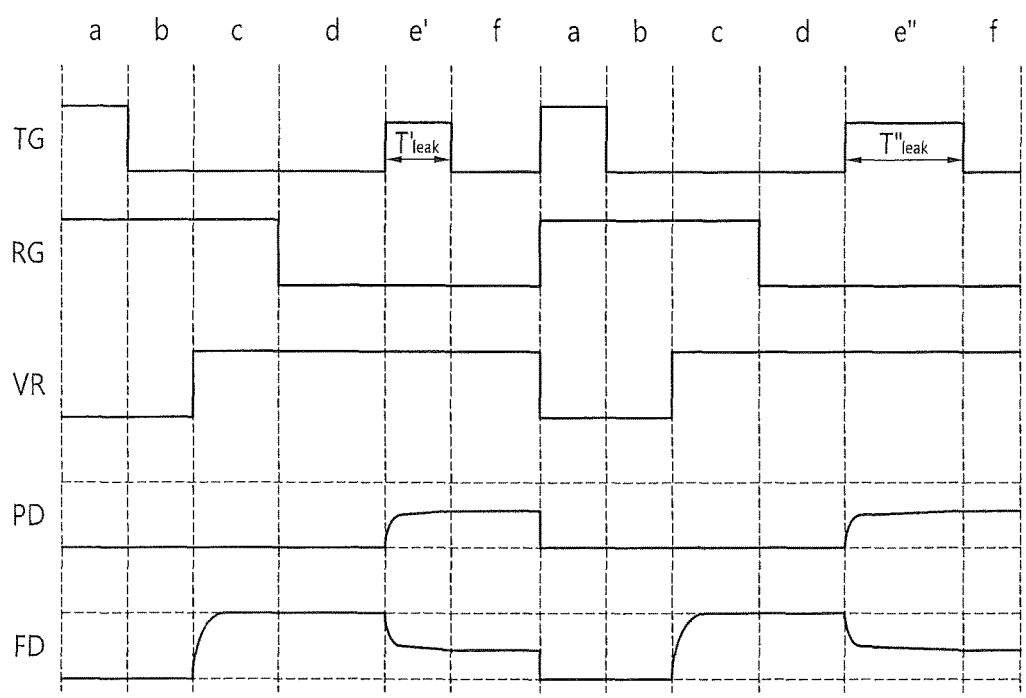
FIG. 7B is a timing diagram that illustrates the timing of voltages associated with the well-potential sequence of FIG. 7A, according to embodiments of the invention.

FIGS. 7A-7B illustrate linear-logarithmic calibration operations according to additional embodiments of the invention, which are related to the embodiments illustrated by FIGS. 1B-1D and 6A-6B. In particular, FIG. 7A illustrates a well potential sequence associated with the left side of the 4T linear-logarithmic image sensor pixel 100 of FIG. 1A and FIG. 7B is a timing diagram that corresponds to the well-potential sequence of FIG. 7A. As shown by these figures, a method of calibrating a linear-logarithmic image sensor pixel 100 can include performing an initial reset of the pixel 100 at step (a) by turning on a transfer transistor 20 and a reset transistor 10. This is done by driving the transfer gate (TG) and reset gate (RG) high to a logic 1 voltage level and driving a drain terminal of the reset transistor 10 to a logic 0 voltage level (e.g., variable reset voltage VR=GND). Thereafter, as shown by step (b), the photodiode (PD) and floating diffusion (FD) region are isolated from each other by turning off the transfer transistor 20 (i.e., TG switches high-to-low). Then, at step (c), the floating diffusion (FD) region is pulled-up (so that $V_{FD}$=lesser of VR and $V_{RG}$−$Vth_{10}$), after the variable reset voltage VR is switched low-to-high as shown by FIG. 7B. At step (d), the floating diffusion (FD) region is isolated by turning off the reset transistor and then a first voltage of the FD region is read to support on-the-fly calibration on a per pixel basis. At step (e) (shown as (e') having a duration of $T'_{leak}$ in FIG. 7B), a first subthreshold leakage current is established between the floating diffusion (FD) region and the cathode of the photodiode 50 by driving the transfer gate (TG) at a mid-level voltage. This causes an increase in cathode voltage and decrease in FD region voltage during the time interval (e'), as shown. Then, as shown by step (f), subthreshold conduction within the transfer transistor 20 is terminated and a second "calibrating" voltage of the FD region is read. As further shown by FIG. 7B, third and fourth "calibrating" voltages may be read from the FD region (where $T''_{leak}$>$T'_{leak}$ at steps (e'') and (e'), respectively, or vice versa) to enable comprehensive calibration of both the linear and logarithmic responses (e.g., KNPT, LOGS) of the pixel 100, as described more fully hereinabove.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of calibrating a linear-logarithmic image sensor pixel, comprising:
    performing a reset of the pixel in advance of establishing a leakage current between a photodiode and a floating diffusion region of the pixel that is allowed to fluctuate in voltage by an amount proportional to a magnitude of the leakage current;
    reading a first voltage of the floating diffusion region after terminating the leakage current and then, without resetting the floating diffusion region, transferring charge between the photodiode and the floating diffusion region of the pixel so that a voltage of a cathode of the photodiode is changed and a voltage of the floating diffusion region is changed relative to the first voltage; and
    then, without resetting the floating diffusion region and after terminating said transferring charge, reading a second voltage of the floating diffusion region.

2. The method of claim 1, wherein said performing a reset comprises turning on a totem pole arrangement of a reset transistor and a transfer transistor so that the cathode of the photodiode can be pulled-down to a voltage of the floating diffusion region; wherein said establishing a leakage current comprises establishing the leakage current while the reset transistor is turned off; and wherein said transferring comprises transferring charge between the photodiode and the floating diffusion region of the pixel so that the voltage of the cathode is increased.

3. The method of claim 2, wherein a source terminal of the transfer transistor is electrically connected to the cathode of the photodiode and a source terminal of the reset transistor is electrically connected to the floating diffusion region; and wherein said performing a reset comprises turning on the reset and transfer transistors so that the cathode of photodiode can be pulled-down to a voltage of a drain terminal of the reset transistor.

4. The method of claim 2, wherein said reading a first voltage is performed while the reset and transfer transistors are turned off.

5. The method of claim 4, wherein said reading a first voltage is followed by turning on the transfer transistor during said transferring charge between the photodiode and the floating diffusion region and then turning off the transfer transistor during said reading a second voltage.

6. The method of claim 2, wherein said terminating the leakage current comprises terminating the leakage current by completely turning off the transfer transistor during said reading the first voltage; and wherein said terminating said transferring charge comprises terminating said transferring charge by completely turning off the transfer transistor during said reading the second voltage.

7. A method of calibrating a linear-logarithmic image sensor pixel, comprising:
    performing a first reset of the pixel in advance of establishing a first leakage current between a photodiode and a floating diffusion region of the pixel that is allowed to fluctuate in voltage by an amount proportional to a magnitude of the first leakage current;
    reading a first voltage of the floating diffusion region after terminating the first leakage current and then, without resetting the floating diffusion region, transferring a first quantity of charge between the photodiode and the floating diffusion region of the pixel so that a voltage of a cathode of the photodiode is increased and a voltage of the floating diffusion region is changed relative to the first voltage;
    then, without resetting the floating diffusion region and after terminating said transferring a first quantity of charge, reading a second voltage of the floating diffusion region; then
    performing a second reset of the pixel in advance of establishing a second leakage current between a photodiode and floating diffusion region of the pixel that is allowed to fluctuate in voltage by an amount proportional to a magnitude of the second leakage current;
    reading a third voltage of the floating diffusion region after terminating the second leakage current and then, without resetting the floating diffusion region, transferring a second quantity of charge between the photodiode and the floating diffusion region of the pixel; and then, without resetting the floating diffusion region and after terminating said transferring a second quantity of charge, reading a fourth voltage of the floating diffusion region.

8. The method of claim 7, wherein the first and second quantities of charge are unequal.

9. The method of claim 8, wherein a duration of said transferring a second quantity of charge is greater than a duration of said transferring a first quantity of charge or vice versa.

10. The method of claim 8, wherein said performing a first reset comprises turning on a totem pole arrangement of a reset transistor and a transfer transistor within the pixel so that a voltage of the cathode of the photodiode can be equilibrated to a voltage of the floating diffusion region.

11. The method of claim 10, wherein a source terminal of the transfer transistor is electrically connected to the cathode of the photodiode and a source terminal of the reset transistor is electrically connected to the floating diffusion region; and wherein said performing a first reset comprises turning on the reset and transfer transistors so that the cathode of the photodiode can be pulled-down to a voltage of a drain terminal of the reset transistor.

12. The method of claim 10, wherein said terminating the first leakage current comprises terminating the first leakage current by completely turning off the transfer transistor during said reading the first voltage; and wherein said terminating said transferring a first quantity of charge comprises terminating said transferring a first quantity of charge by completely turning off the transfer transistor during said reading the second voltage.

13. The method of claim 11, wherein said terminating the first leakage current comprises terminating the first leakage current by completely turning off the transfer transistor during said reading the first voltage; and wherein said terminating said transferring a first quantity of charge comprises terminating said transferring a first quantity of charge by completely turning off the transfer transistor during said reading the second voltage.

* * * * *